US007821080B2

(12) United States Patent
Zhang

(10) Patent No.: US 7,821,080 B2

(45) **Date of Patent: *Oct. 26, 2010**

(54) ***N*-ARY THREE-DIMENSIONAL MASK-PROGRAMMABLE READ-ONLY MEMORY**

(76) Inventor: Guobiao Zhang, P.O. Box 6182, Stateline, CA (US) 89449-6182

( * ) Notice: Subject to any disclaimer, the term of this patent is extended or adjusted under 35 U.S.C. 154(b) by 0 days.

This patent is subject to a terminal disclaimer.

(21) Appl. No.: 12/477,912

(22) Filed: Jun. 4, 2009

(65) Prior Publication Data

US 2009/0237976 A1 Sep. 24, 2009

Related U.S. Application Data

(63) Continuation-in-part of application No. 11/162,262, filed on Sep. 2, 2005, now Pat. No. 7,633,128.

(60) Provisional application No. 60/700,037, filed on Jul. 15, 2005.

(51) Int. Cl.
*H02L 29/72* (2006.01)

(52) U.S. Cl. ....................... 257/390; 257/211; 257/368; 257/401; 341/56

(58) Field of Classification Search ................. 257/211, 257/368, 390, 401; 341/56
See application file for complete search history.

(56) References Cited

U.S. PATENT DOCUMENTS

| | | | | |
|---|---|---|---|---|
| 4,404,655 | A | 9/1983 | Naiff | 365/104 |
| 4,424,579 | A | 1/1984 | Roesner | 365/105 |
| 4,598,386 | A | 7/1986 | Roesner | 365/105 |
| 4,603,341 | A | 7/1986 | Bertin et al. | 357/23.7 |
| 4,796,074 | A | 1/1989 | Roesner | 357/51 |
| 5,257,224 | A | 10/1993 | Nojiri et al. | 365/175 |
| 5,272,370 | A | 12/1993 | French | 257/353 |
| 5,455,435 | A | 10/1995 | Fu et al. | 257/328 |
| 5,468,983 | A | 11/1995 | Hirase et al. | 257/344 |
| 5,751,012 | A | 5/1998 | Wolstenholme et al. | 257/5 |
| 5,825,686 | A | 10/1998 | Schmitt-Landsiedel et al. | 365/185.03 |
| 5,835,396 | A | 11/1998 | Zhang | 365/51 |
| 5,841,150 | A | 11/1998 | Gonzalez et al. | 257/3 |
| 5,843,824 | A | 12/1998 | Chou et al. | 438/278 |
| 5,847,442 | A | 12/1998 | Mills, Jr. et al. | 257/536 |
| 5,854,111 | A | 12/1998 | Wen | 438/275 |
| 5,904,526 | A | 5/1999 | Wen et al. | 438/275 |
| 5,907,778 | A | 5/1999 | Chou et al. | 438/275 |
| 5,943,255 | A | 8/1999 | Kutter et al. | 365/94 |
| 6,015,738 | A | 1/2000 | Levy et al. | 438/275 |
| 6,021,079 | A | 2/2000 | Worley | 365/225.7 |
| 6,049,481 | A | 4/2000 | Yamasaki | 365/185.23 |
| 6,221,723 | B1 | 4/2001 | Kunitou | 438/276 |

(Continued)

OTHER PUBLICATIONS

U.S. Appl. No. 11/162,262, filed Sep. 2, 2005, Zhang.

(Continued)

*Primary Examiner*—Edward Wojciechowicz

(57) ABSTRACT

N-ary three-dimensional mask-programmable read-only memory (N-3DMPROM) stores multi-bit-per-cell. Its memory cells can have N states (N>2) and data are stored as N-ary codes. N-3DMPROM has a larger storage density than the prior-art binary 3D-MPROM. One advantage of N-3DROM over other N-ary memory (e.g. multi-level-cell flash) is that its array efficiency can be kept high. N-3DM-PROM could be geometry-defined, junction-defined, or a combination thereof.

20 Claims, 11 Drawing Sheets

U.S. PATENT DOCUMENTS 6,385,074 B1 5/2002 Johnson et al. ............. 365/103
6,420,215 B1 7/2002 Knall et al. ................. 438/131
6,461,906 B1 10/2002 Lung .......................... 438/216
6,515,888 B2 2/2003 Johnson et al. ............. 365/130
6,624,485 B2 9/2003 Johnson ...................... 257/390
6,646,913 B2 11/2003 Micheloni et al. ...... 365/185.03
6,717,222 B2 4/2004 Zhang ........................ 257/390
6,794,253 B2 9/2004 Lin et al. .................... 438/276
6,809,948 B2 10/2004 Nachumovsky et al. ....... 365/96
6,816,407 B2 11/2004 Rolandi ................. 365/185.03
6,821,841 B1 11/2004 Wu et al. .................... 438/243
6,822,898 B2 11/2004 Matsui .................. 365/185.03
6,853,028 B2 2/2005 Kim et al. ................... 257/315
7,071,849 B2 7/2006 Zhang ......................... 341/56
7,167,109 B2 1/2007 Hu et al. ...................... 341/56
7,633,128 B2 * 12/2009 Zhang ........................ 257/390
2005/0050434 A1 3/2005 Lunelli et al. ............... 714/793

OTHER PUBLICATIONS

Micheloni et al. "The Flash Memory Read Path: Building Blocks and Critical Aspects", *Proceedings of the IEEE*, pp. 537-551, Apr. 2003.

* cited by examiner

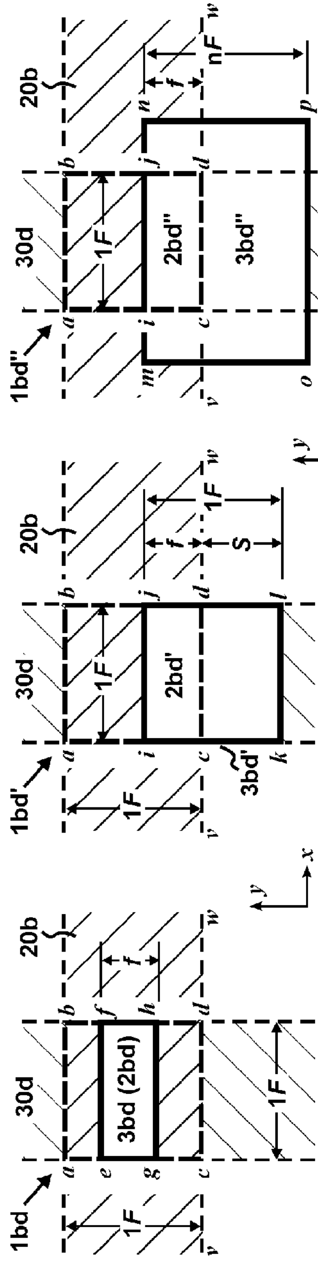
Fig. 3AA
Fig. 3BA
Fig. 3CA
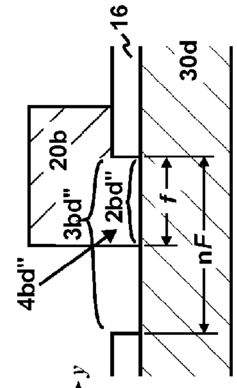
Fig. 3CB
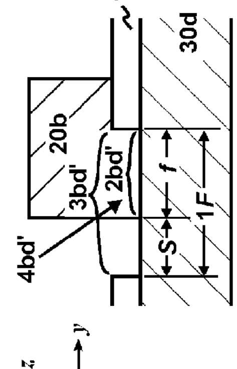
Fig. 3BB
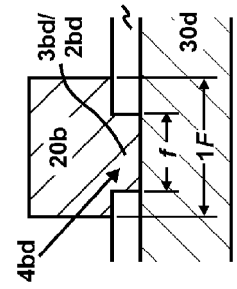
Fig. 3AB
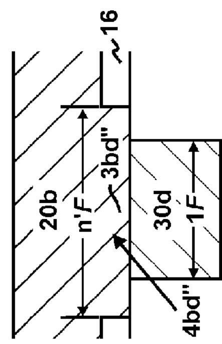
Fig. 3CC
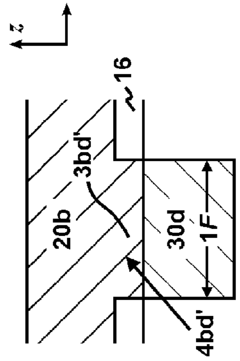
Fig. 3BC
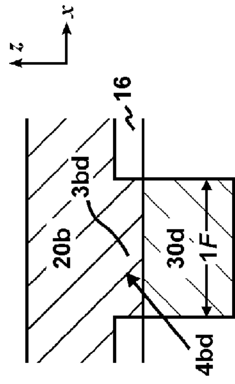
Fig. 3AC

| $r$ | "$0_4$" | "$1_4$" | "$2_4$" | "$3_4$" |
|---|---|---|---|---|
| Even Distribution | 0 | 0.33 | 0.67 | 1 |
| Un-even Distribution | 0 | 0.37 | 0.64 | 1 |

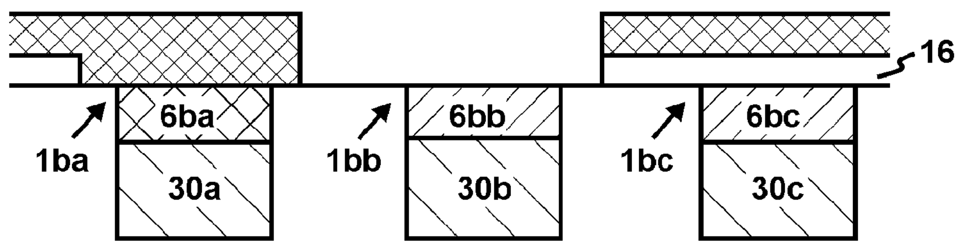
Fig. 9C
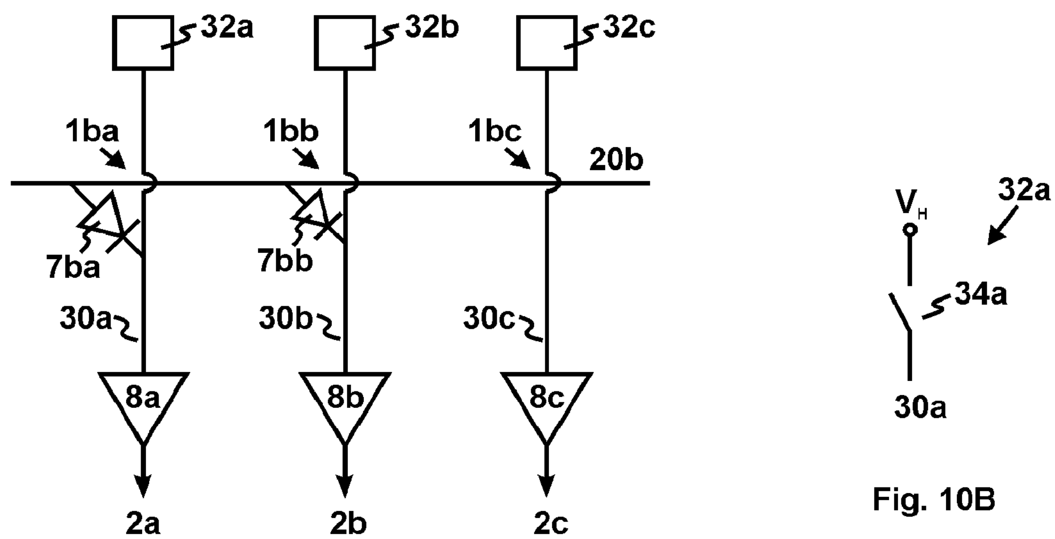
Fig. 10A
Fig. 10B
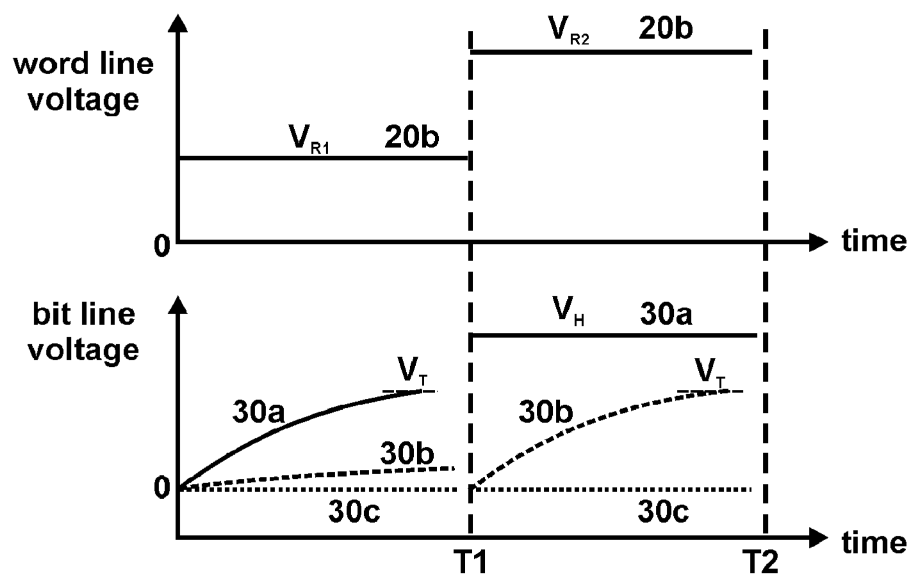
Fig. 10C

N-ARY THREE-DIMENSIONAL MASK-PROGRAMMABLE READ-ONLY MEMORY

CROSS-REFERENCE TO RELATED APPLICATIONS

This application is a continuation-in-part of U.S. patent application Ser. No. 11/162,262, filed Sep. 2, 2005, which is related to a provisional application Ser. No. 60/700,037, filed Jul. 15, 2005.

BACKGROUND

1. Technical Field of the Invention

The present invention relates to the field of integrated circuits, and more particularly to mask-programmable read-only memory (MPROM).

2. Prior Arts

Mask-programmable read-only memory refers to those types of memories into which data are written during the manufacturing process, more particularly through pattern transfer. Among all kinds of mask-programmable read-only memories, three-dimensional mask-programmable read-only memory (3D-MPROM) has an extremely large capacity and low cost.

U.S. Pat. No. 5,835,396, issued to Zhang on Nov. 10, 1998, describes a typical 3D-MPROM. As illustrated in FIG. 1A, a 3D-MPROM typically comprises a semiconductor substrate 0*s* and a 3D-MPROM stack 0, which is stacked above the substrate 0*s*. Transistors are built in the semiconductor substrate 0*s* using standard technology. This 3D-MPROM stack 0 comprises two vertically stacked memory levels (ML): 100 and 200. They are laid down parallel to the substrate 0*s*, i.e. in the x-y plane and the memory level 200 is stacked above the memory level 100, i.e. along the z direction. Each memory level (e.g. 100) comprises a plurality of address-selection lines (e.g. 20*a*, 20*b* . . . ; 30*a*, 30*b* . . . ) and memory cells (e.g. 1*aa*, 1*ab*, 1*bb*, 1*ba* . . . ). Contact vias (e.g. 20*av*) couple memory levels (e.g. 100) to the transistors in the substrate 0*s*.

In prior arts, 3D-MPROM is binary, i.e. its memory cells have two states and each cell can store a single bit. FIG. 1B is the top view of two prior-art binary 3D-MPROM cells 1*ba*, 1*bb*, and FIG. 1C is its cross-sectional view. Each cell (e.g. 1*ba*) comprises an upper address-selection line (ASL) (e.g. 20*b*) and a lower ASL (e.g. 30*b*). An insulating dielectric 16 separates the upper ASL from the lower ASL. Existence or absence of an opening in the insulating dielectric 16 determines the information stored in the cell. At cell 1*bb*, because no opening exists in the insulating dielectric, no current flows during read and this cell represents logic "0". On the other hand, at cell 1*ba*, because there exists a full-opening 3*ba*, a read current flows during read and this cell represents logic "1". Note this full-opening exposes the whole overlapping area between the upper ASL 20*b* and the lower ASL 30*a*. Because it stores single-bit-per-cell, the prior-art binary 3D-MPROM has a limited storage density. It is highly desirable for an 3D-MPROM to store multi-bit-per-cell. Accordingly, the present invention discloses an N-ary (N>2) three-dimensional mask-programmable read-only memory (N-3DMPROM).

OBJECTS AND ADVANTAGES

It is a principle object of the present invention to improve the storage density of three-dimensional mask-programmable read-only memory (3D-MPROM).

It is a further object of the present invention to store multi-bit-per-cell in a 3D-MPROM.

It is a further object of the present invention to improve the array efficiency of the N-ary memory.

In accordance with these and other objects of the present invention, an N-ary (N>2) three-dimensional mask-programmable read-only memory (N-3DMPROM) is disclosed.

SUMMARY OF THE INVENTION

The present invention discloses an N-ary (N>2) three-dimensional mask-programmable read-only memory (N-3DMPROM). Its memory cells have N(N>2) states. Memory cells in different states have different ranges of read current at a read voltage. Data are stored as N-ary codes. Since it stores $\log_2 N$ (N>2) bits per-cell, N-3DMPROM has a larger storage density than the binary 3D-MPROM, which stores single-bit-per-cell.

The N-3DMPROM of the present invention comprises: a semiconductor substrate including transistors; a plurality of vertically stacked mask-programmable memory levels, said memory levels stacked above and coupled to said substrate, each of said memory level comprising a plurality of address-selection lines and mask-programmable memory cells, each of said memory cells comprising a diode-like device and having one of at least N possible states with N>2, wherein memory cells in different states have different ranges of read current at a read voltage; wherein said substrate further comprises means for converting data from said memory levels into binary.

N-3DMPROM includes geometry-defined N-3DMPROM and junction-defined N-3DMPROM. In a geometry-defined N-3DMPROM, memory cells in at least three different states have different geometries. Commonly varied cell geometry is diode-area, which is the smallest current conduction area in the memory cell. Besides full-diode of FIG. 1B (corresponding to full-opening 3*ba*), N-3DMPROM uses partial-diode, whose diode-area is smaller than the overlapping area between the upper and lower ASLs. When an nF-opening process (F—ASL line width) is used, partial-diode (feature size <1F) can be implemented with an nF (n≧1)-opening mask (feature size ≧1F).

In a junction-defined N-3DMPROM, memory cells in at least two different states have different junctions. A commonly varied junction is doping profile. During read, successively larger read voltages are applied to the word line in sequence. After a cell-under-read is sensed as "1" (i.e. its read current is large enough to trigger the sense-amp), a current-limiting circuit will be turned on to limit the current flow through the cell-under-read. This can protect the cell-under-read.

One advantage of N-3DMPROM is that its array efficiency (i.e. the ratio of the memory array area to the whole chip area) can be kept high. Because its memory stack and peripheral circuit (including N-ary-to-binary encoder) are located at different levels (above substrate vs. in substrate), the peripheral circuit (including N-ary-to-binary encoder) can be folded under the memory stack. As a result, N-3DMPROM can have a similar array efficiency as the prior-art binary 3D-MPROM. On the other hand, for other N-ary memory such as the multi-level-cell (MLC) flash, because memory cells and peripheral area located at the same level (both in substrate), the N-ary-to-binary encoder consumes extra chip area and this results in a worse array efficiency.

In many cases of N-3DMPROM, N is a non-integral power of 2 (i.e. $N=2^x$, x is a non-integer). During read, a plurality of cells are decoded collectively—in unit of word. Each word comprises readout from j N-ary cells (j—word-width, j≧2 is an integer). They are fed into an N-ary-to-binary encoder and converted into i binary bits, with $i \leqq INT[\log_2(N^m)]$. Here, INT[x] is the largest integer smaller than x. By averaging i bits into m cells, each cell effectively stores fractional bits.

BRIEF DESCRIPTION OF THE DRAWINGS

FIGS. 3AA-3AC is a top view, y-z cross-sectional view and z-x cross-sectional view of a first preferred geometry-defined N-3DMPROM cell; FIGS. 3BA-3BC is a top view, y-z cross-sectional view and z-x cross-sectional view of a second preferred geometry-defined N-3DMPROM cell; FIGS. 3CA-3CC is a top view, y-z cross-sectional view and z-x cross-sectional view of a third preferred geometry-defined N-3DMPROM cell;

FIGS. 9A-9C illustrate a preferred manufacturing process of the preferred junction-defined N-3DMPROM;

FIG. 10A illustrates a preferred read-out circuit for the preferred junction-defined N-3DMPROM; FIG. 10B illustrates a preferred current-limiting circuit; FIG. 10C is a timing-diagram of the word-line voltage and bit-line voltage during read;

This disclosure is focused on opening-patterns and read-out circuits of N-3DMPROM. For reason of simplicity, diodes or diode layers (or other ROM layers such as quasi-conductive layer) are intentionally left un-drawn in some figures. Details on 3D-MPROM can be found in U.S. Pat. Nos. 5,835,396, 6,717,222 and others.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

The present invention discloses an N-ary (N>2) three-dimensional mask-programmable read-only memory (N-3DMPROM). Its memory cells have N(N>2) states. Memory cells in different states have different ranges of read current at a read voltage. Data are stored as N-ary codes. Since it stores $\log_2 N$(N>2) bits per-cell, N-3DMPROM has a larger storage density than the binary 3D-MPROM, which stores single-bit-per-cell.

Figure 2A:
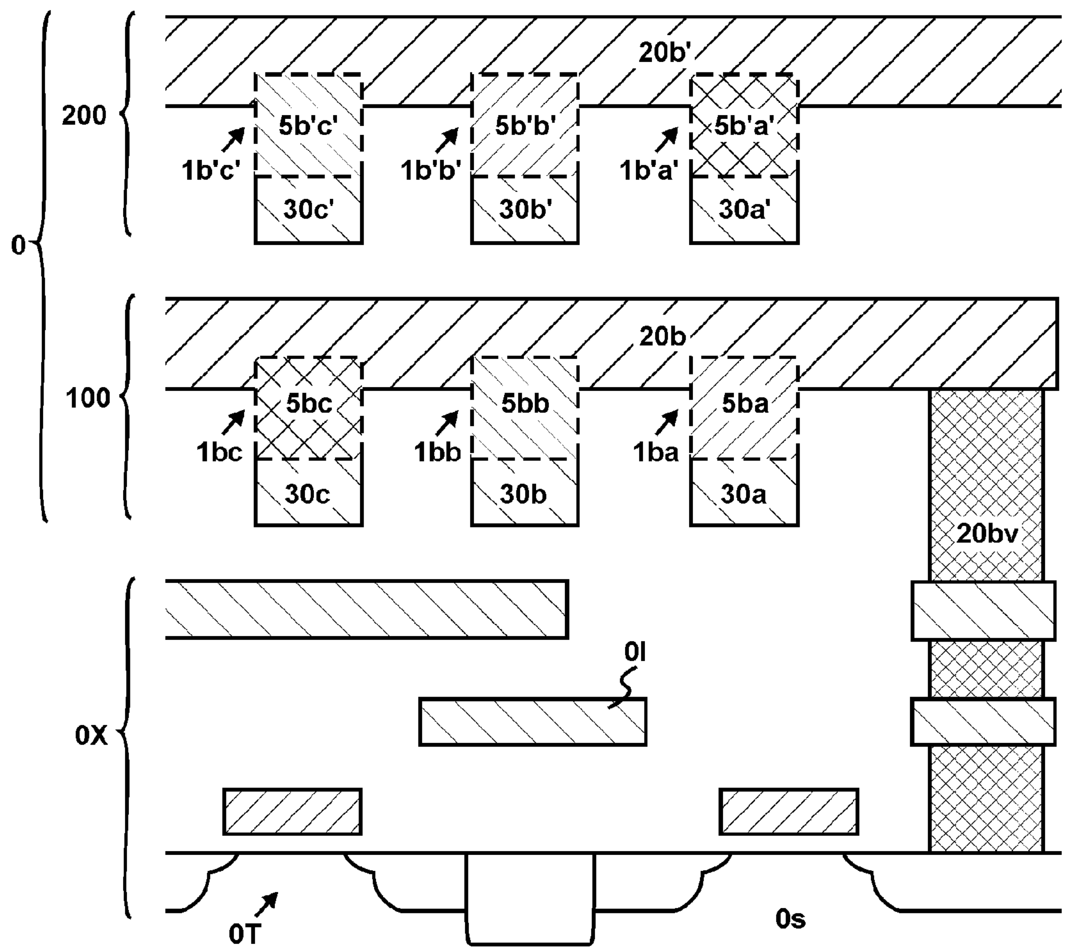
FIG. 2A is a cross-sectional view of a preferred N-ary 3D-MPROM (N-3DMPROM)

FIG. 2A is a cross-sectional view of a preferred N-3DMPROM. It comprises a substrate 0*s* and a 3D-MPROM stack 0. The substrate 0*s* comprises a plurality of transistors 0T. These transistors 0T and their interconnects 0I form a substrate circuit 0X. The 3D-MPROM stack 0 comprises a plurality of vertically stacked memory levels. In this preferred embodiment, there are two memory levels 100, 200. They are coupled to the substrate circuit 0X through a plurality of contact vias 20*bv*. Each memory level (e.g. 100) comprises a plurality of upper address-selection lines (ASL) (20*b* . . . ) and lower ASLs (30*a*-30*c* . . . ). A plurality of mask-programmable memory cells (1*ba*-1*bc* . . . ) are located at the intersections of the upper and lower ASLs. Each of these memory cells comprises a diode-like device, which is sandwiched between the upper and lower ASLs. The diode-like device conducts current more readily in one direction that the other. Examples of diode-like device include p-n diode, p-i-n diode, Schottky diode. It could take the form of poly-crystalline, micro-crystalline, or amorphous; and use semiconductor material such as silicon, germanium, carbon, or a combination thereof. Details on 3D-MPROM are disclosed in U.S. Pat. Nos. 5,835,396, 6,717,222 and others.

This preferred embodiment is a ternary (3-ary) 3D-MPROM, i.e. each of its memory cells has one of 3 different states—“0”, “1” and “2”. For example, memory cell 1*bc* represents state “2” and its cell area 5*bc* is denoted by the cross-hatched shading; memory cell 1*bb* represents state “1” and its cell area 5*bb* is denoted by the left-slanted shading; memory cell 1*ba* represents state “0” and its cell area 5*ba* is denoted the right-slanted shading. As another example, memory cells 1*b'c'*-1*b'a'* represent states “1”, “0”, “2”, respectively. Data are stored in the ternary 3D-MPROM as ternary (3-ary) codes. For example, cells 1*bc*-1*ba*, storing the 3-ary code $210_3$, represents a 10-ary number $21_{10}$. Here, the subscript of $C_N$ denotes C is an N-ary code, e.g. $21_{10}$ denotes 21 is a 10-ary code; $210_3$ denotes 210 is a 3-ary code. To store a number like $21_{10}$, ternary 3D-MPROM need three cells ($21_{10}=210_3$), but binary 3D-MPROM need five cells ($21_{10}=10101_2$). As a result, ternary 3D-MPROM has a larger storage density than binary 3D-MPROM. It should be apparent to those skilled in the art that the storage density of N-3DMPROM further increases with N.

Figure 2B:
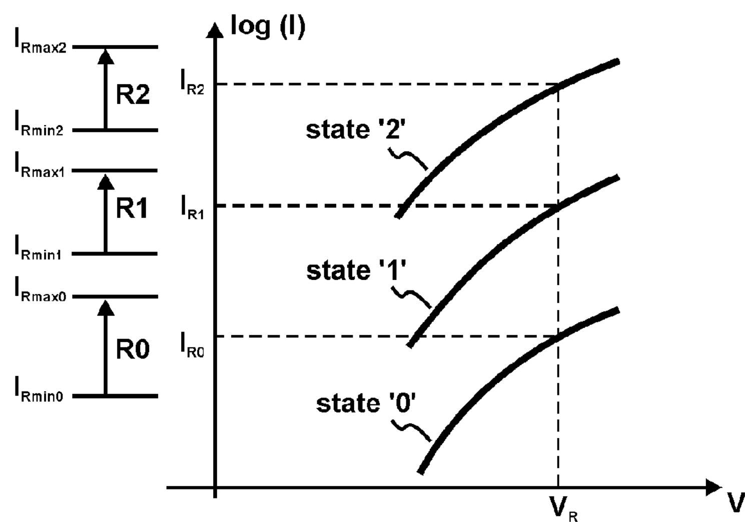
FIG. 2B illustrates the current-voltage (I-V) relationship for memory cells in different states.

FIG. 2B illustrates the current-voltage (I-V) relationship for memory cells in different states. The upper I-V curve corresponds to the memory cells in state “2”; the middle I-V curve corresponds to the memory cells in state “1”; and the lower I-V curve corresponds to the memory cells in state “0”. At read voltage $V_R$, memory cells in different states have different read current $I_R$’s: $I_{R0}$, $I_{R1}$ and $I_{R2}$ For states “0”, “1”, and “2”, respectively.

In an N-ary 3D-MPROM, multiple boundary values are specified for the read current $I_R$; and a state value is assigned to each memory cell according to which range its read current $I_R$ belongs to, among multiple ranges specified by these boundary values. To be more specific, range R2 is specified by boundary values $I_{Rmax2}$ and $I_{Rmin2}$, with $I_{Rmax2}$ the upper limit of range R2 and $I_{Rmin2}$ the lower limit, and a memory cell is assigned to state “2” if its read current $I_R$ is within range R2; range R1 is specified by boundary values $I_{Rmax1}$ and $I_{Rmin1}$, with $I_{Rmax1}$ the upper limit of range R1 and $I_{Rmin1}$ the lower limit, and a memory cell is assigned to state “1” if its read current $I_R$ is within range R1; range R0 is specified by boundary values $I_{Rmax0}$ and $I_{Rmin0}$, with $I_{Rmax0}$ the upper limit of range R0 and $I_{Rmin0}$ the lower limit, and a memory cell is assigned to state "0" if its read current $I_R$ is within range R0. Accordingly, memory cells in different states have different ranges of read current.

It should be apparent to those skilled in the art that these ranges of read current should not overlap. The ranges R0, R1 and R2 of FIG. 2B are discontinuous. For example, the lower limit $I_{Rmin2}$ of range R2 is larger than the upper limit $I_{Rmax1}$ of range R1. Alternatively, these ranges can be continuous. For example, the lower limit $I_{Rmin2}$ of range R2 is equal to the upper limit $I_{Rmax1}$ of range R1.

Figure 2C:
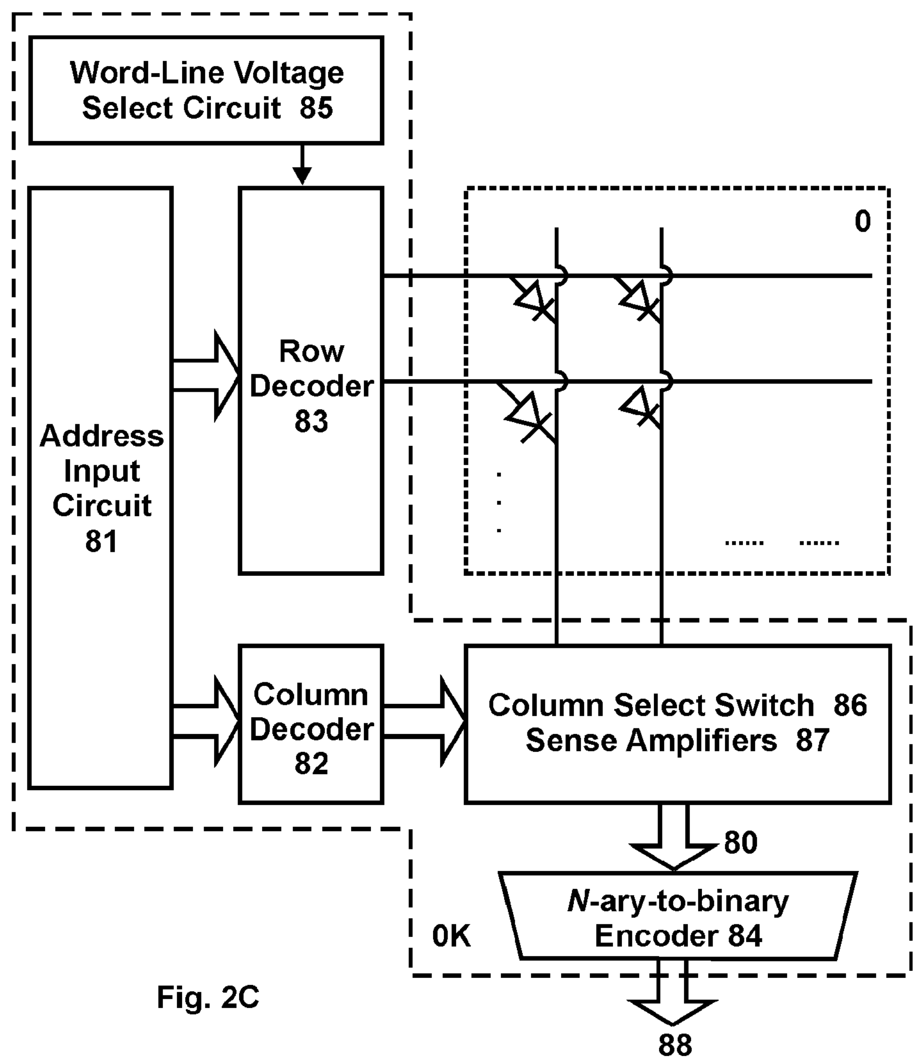
FIG. 2C is a block diagram for a preferred N-3DMPROM peripheral circuit.

FIG. 2C is a block diagram for a preferred N-3DMPROM peripheral circuit 0K. It comprises a word-line voltage select circuit 85, address input circuit 81, row decoder 83, column decoder 82, column select switch 86, sense amplifiers 87 and N-ary-to-binary decoder 84. The peripheral circuit 0K is coupled to the memory stack 0, which comprises a plurality of memory cells, word lines and bit lines. Each memory cell comprises a diode-like device.

In this preferred peripheral circuit 0K, the word-line voltage select circuit 85 selects a voltage according to the operation and supplies it to the row decoder 83. The address input circuit 81 receives an address signal supplied from the outside and supplies it to the row decoder 83 and the column decoder 82. The row decoder 83 raises the voltage on the selected word line. Depending on the state of the memory cells, the voltage on the bit lines changes at different rate. The column select switch 86 selects bit lines to be connected to sense amplifiers 87 according to the signal from the column decoder 82. The readout 80 of the sense amplifiers 87 is fed into an N-ary-to-binary decoder 84. This N-ary-to-binary decoder 84 converts the sense-amp readout 80 into binary output 88.

Similar to the MLC flash memory, the N-3DMPROM peripheral circuit 0K is formed by transistors. However, unlike the MLC flash memory whose cells are formed by transistors in the substrate, the N-3DMPROM memory cells are formed by diodes above the substrate. Accordingly, at least a portion of the N-3DMPROM peripheral circuit 0K can be placed directly under the memory cells. This implies that the binary 3D-MPROM and N-3DMPROM can have the same chip area, or same array efficiency. In contrast, for the MLC flash memory, its peripheral circuit has to be placed side-by-side to its memory cells. This implies that the MLC flash memory occupies a larger chip area than the binary flash memory, or has a worse array efficiency. Considering binary 3D-MPROM already has a higher array efficiency than the binary flash memory, N-3DMPROM has an even higher array efficiency than other N-ary memory such as the MLC flash memory.

Figure 2D:
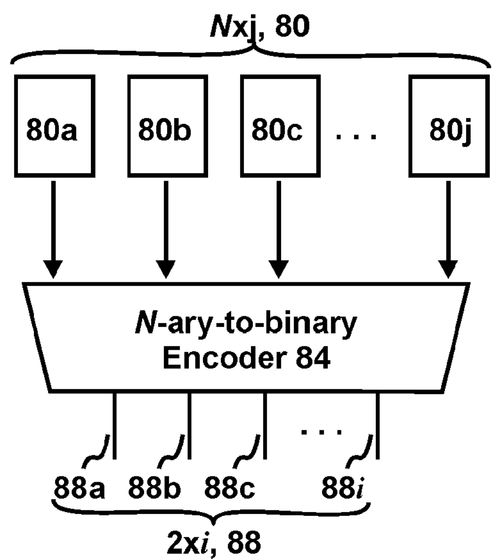
FIG. 2D illustrates a preferred N-ary-to-binary encoder.

In many cases of N-3DMPROM, N is a non-integral power of 2 (i.e. $N=2^x$, x is a non-integer). FIG. 2D illustrates a preferred N-ary-to-binary encoder 84. During read, a plurality of cells are decoded collectively—in unit of word. Each word comprises readout from j N-ary cells 80_a_ . . . 80_j_ (j—word-width, j≧2 is an integer). They are fed into an N-ary-to-binary encoder 84 and converted into i binary bits 88_a_ . . . 88_i_, with $i \leqq INT[\log_2(N^m)]$. Here, INT[x] is the largest integer smaller than x. By averaging i bits into m cells, each cell effectively stores fractional bits. Details on fractional bits are disclosed in U.S. Pat. Nos. 7,071,849, 7,167,109 and others.

Figure 1A:
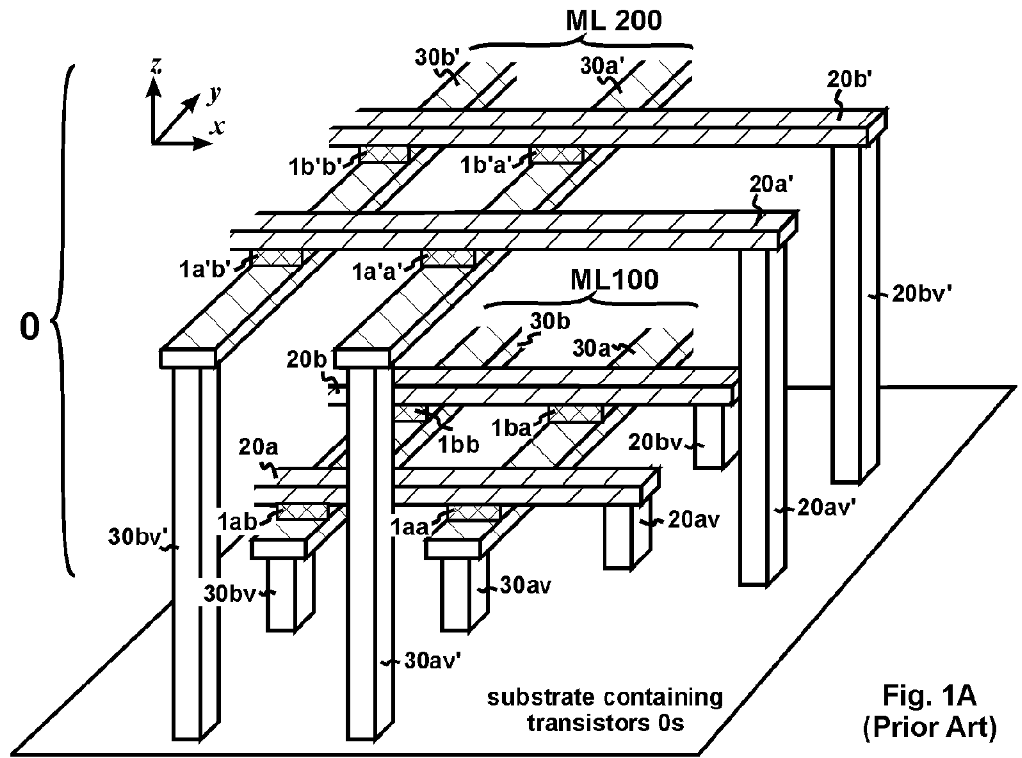
FIG. 1A is a perspective view of a prior-art three-dimensional mask-programmable read-only memory (3D-MPROM)
Figure 1B:
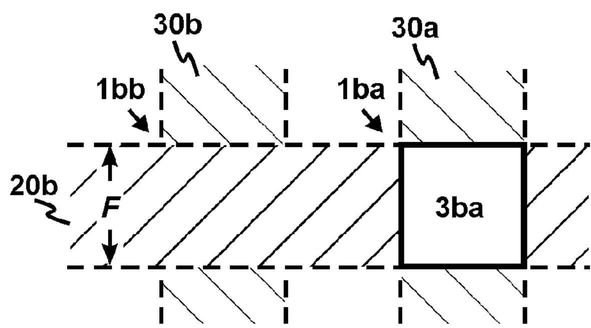
FIG. 1B is a top view of two prior-art 3D-MPROM cells 1*ba*, 1*bb*.
Figure 1C:
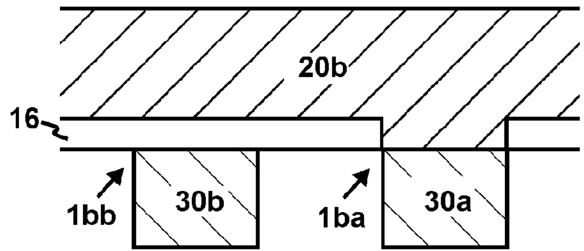
FIG. 1C is a cross-sectional view of cells 1*ba*, 1*bb;*

FIGS. 3AA-3CC illustrate three preferred geometry-defined N-3DMPROM. In the geometry-defined N-3DMPROM, memory cells in at least three different states have different geometries. Commonly varied cell geometry is diode-area, which is the smallest current conduction area in the memory cell. Besides full-diode of FIG. 1B (corresponding to full-opening 3_ba_), N-3DMPROM uses partial-diode, whose diode-area is smaller than the overlapping-area (i.e. the overlapping area between upper and lower ASLs).

In FIGS. 3AA-3AC, a partial-opening 'efgh' 3_bd_ is used to form a partial-diode 4_bd_. Because it is located near the center of the overlapping-area 'abcd', this partial-opening 3_bd_ has the same area as the diode-area 2_bd_. The conductive material in the partial-opening 3_bd_ becomes portion of the partial-diode 4_bd_. The diode-area ratio r, defined as the areal ratio between the diode-area 'efgh' and the overlapping-area 'abcd', can be expressed as:

$$r = (\text{diode-area})/(\text{overlapping-area}) = f/F.$$

where F is the ASL line width. Accordingly, the read current of cell 1_bd_ is ~1/r of that of a full-diode (e.g. cell 1_ab_ of FIG. 1B), but much larger than the cell with no-opening (e.g. cell 1_aa_ of FIG. 1B).

To implement the partial-diode 4_bd_ of FIG. 3AA, the preferred embodiment of FIGS. 3AA-3AC needs to use a sub-1F-opening mask (feature size <1F). This mask is expensive. Fortunately, with an nF-opening process (referring to FIGS. 4A-4D), a less expensive nF (n≧1)-opening mask (feature size ≧1F) can be used to implement the same partial-diode. FIGS. 3BA-3CC illustrate two preferred geometry-defined N-3DMPROM cells based on nF-opening process.

In FIGS. 3BA-3BC, the opening-pattern 'ijkl' 3_bd_' (which is formed in the photoresist by the opening mask during pattern transfer) has a feature size of 1F, i.e. a dimension of 1F×1F. It is shifted against the upper ASL 20_b_ by an offset S (=1F−f) along the −y direction. Based on the nF-opening process, the final diode-area 'ijcd' 2_bd_' is formed at the intersection of the overlapping-area 'abcd' and the opening-pattern 'ijkl' 3_bd_'. It has a dimension of f×1F. same in size as the partial-opening 3_bd_ of FIG. 3AA. In this preferred embodiment, the partial-diode 4_bd_' has an edge 'cd' aligned with an edge 'vw' of the upper ASL 20_b_.

In FIGS. 3CA-3CC, the opening-pattern 'mnop' 3_bd_" has a feature size of >1F, i.e. a dimension of nF×n'F, with both n, n'>1. Compared with FIG. 3BA, the opening-pattern 3_bd_" not only expands along the −y direction, but also along +x and −x directions. Based on the nF-opening process, the final diode-area 'ijcd' 2_bd_" is formed at the intersection of the overlapping-area 'abcd' and the opening-pattern 'mnop'3_bd_". As long as the opening-pattern 3_bd_" overlaps with the upper ASL 20_b_ by f along the +y direction, the diode-area 2_bd_" still has a dimension of f×1F, same as that in FIG. 3AA. Similarly, the partial-diode 4_bd_" has an edge 'cd' aligned with an edge 'vw' of the upper ASL 20_b_.

In FIGS. 3BA-3CC, the feature size of the opening-patterns 3_bd_', 3_bd_" is ≧1F. Accordingly, the opening mask associated with these opening-patterns is referred to as nF(n≧1)-opening mask. Apparently, nF-opening mask is less expensive than the sub-1F-opening mask (used for FIGS. 3AA-3AC). Furthermore, in FIG. 3CA, the final shape of the diode-area 2_bd_" is only defined by the location of the edge 'ij', not by any other edges (e.g. 'mo', 'op'). As a result, except for the edge 'ij', the opening-patterns 3_bd_', 3_bd_" do not require critical edge control. In other words, the nF-opening mask could be a low-precision mask. This can further help drive down the mask cost. Details on nF-opening mask are disclosed in U.S. Pat. No. 6,903,427 and others.

Figure 4A:
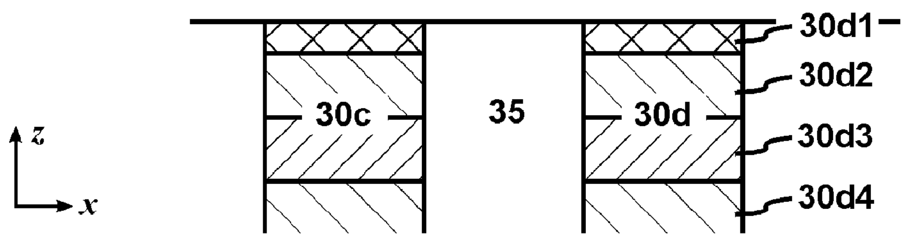
FIGS. 4A-4D illustrate the manufacturing steps of a preferred nF-opening process.
Figure 4B:
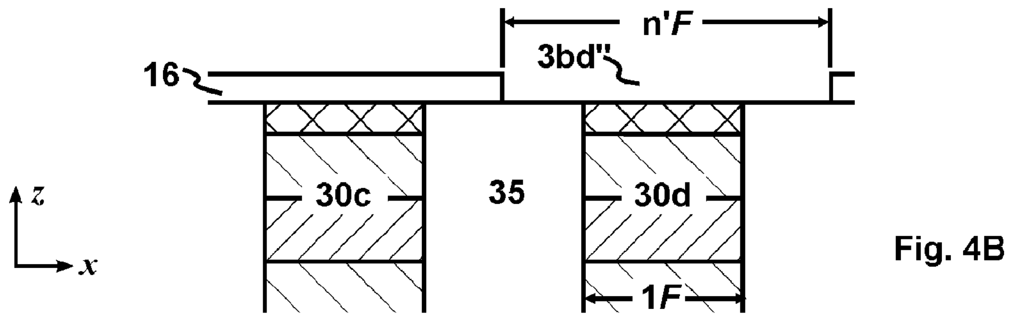
Figure 4C:
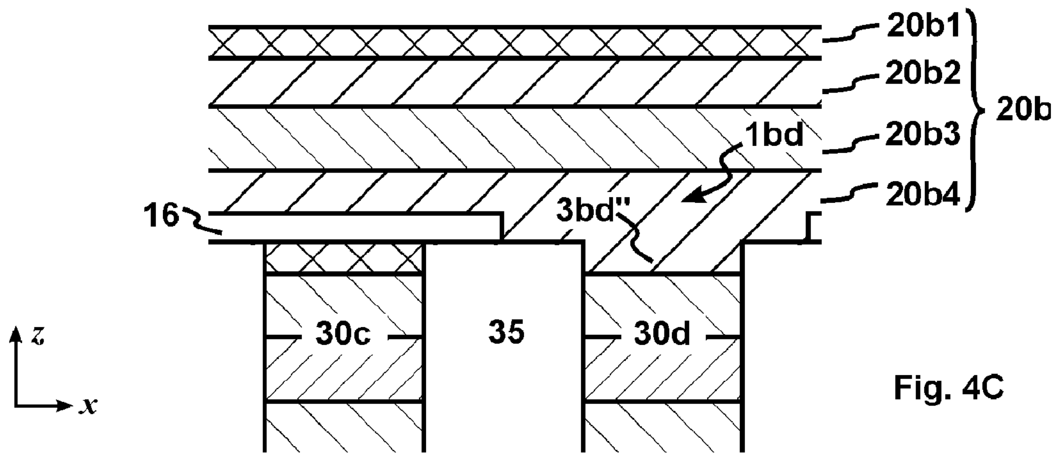
Figure 4D:
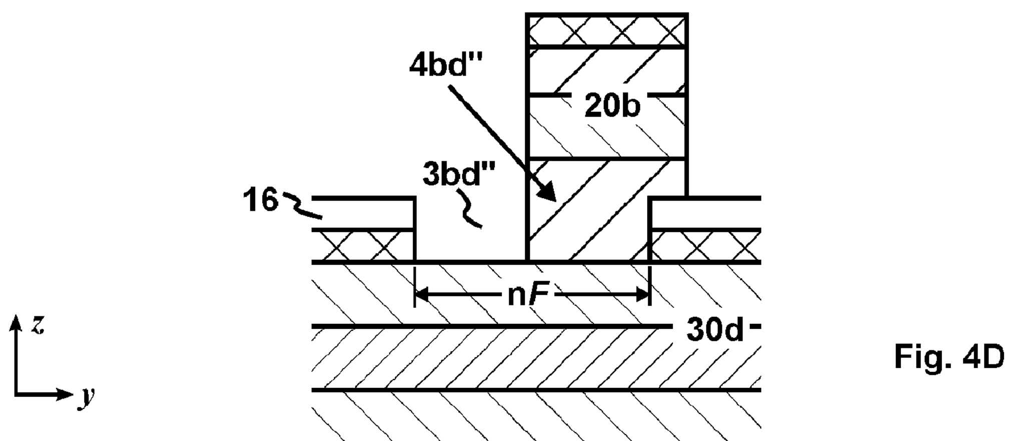

Referring now to FIGS. 4A-4D, a preferred manufacturing process for the partial diode 1_bd_" in FIGS. 3CA-3CC is disclosed. Because it uses an nF-opening mask, this process is also referred to as nF-opening process. FIGS. 4A-4C are the z-x cross-sectional views; FIG. 4D is the y-z cross-sectional view. It comprises the following steps:

A) Deposit a first N-silicon layer 30d4, a conductive layer 30d3, a second N-silicon layer 30d2 and a polish-stop layer 30d1. The polish-stop layer 30d1 (e.g. silicon nitride) is optional and can act as a stop layer for the CMP step. After the deposition, etch these layers to form the lower ASLs 30c, 30d and fill in an intra-level dielectric 35 therebetween. Next, perform a CMP step until the polish-stop layer 30d1 is exposed.

B) Deposit an insulating dielectric 16 on top of the planarized lower ASLs 30c, 30d. Apply the nF-opening mask and remove the insulating dielectric 16 at selected locations (e.g. 3bd"). Because n≧1, the resultant opening-pattern 3bd" has dimensions (nF, n'F, with n, n'≧1) larger than or equal to the ASL width (1F).

C) Remove the polish-stop layer 30d1 until the second N-silicon layer 30d2 is exposed. Deposit a first P-silicon layer 20b4, another conductive layer 20b3, a second P-silicon layer 20b2, and another polish-stop layer 20b1. Etch these layers to form the upper ASL 20b.

From the above processing steps, it can be observed that, in the nF-opening process, partial-diode 4bd" is formed at the intersection of the overlapping-area and the opening-pattern. Accordingly, expansion of the opening-pattern outside the overlapping-area has no effect on the final shape of the partial-diode. This opening-pattern can be further merged with opening-patterns from adjacent cells so that a single opening-pattern can be formed.

Figure 5A:
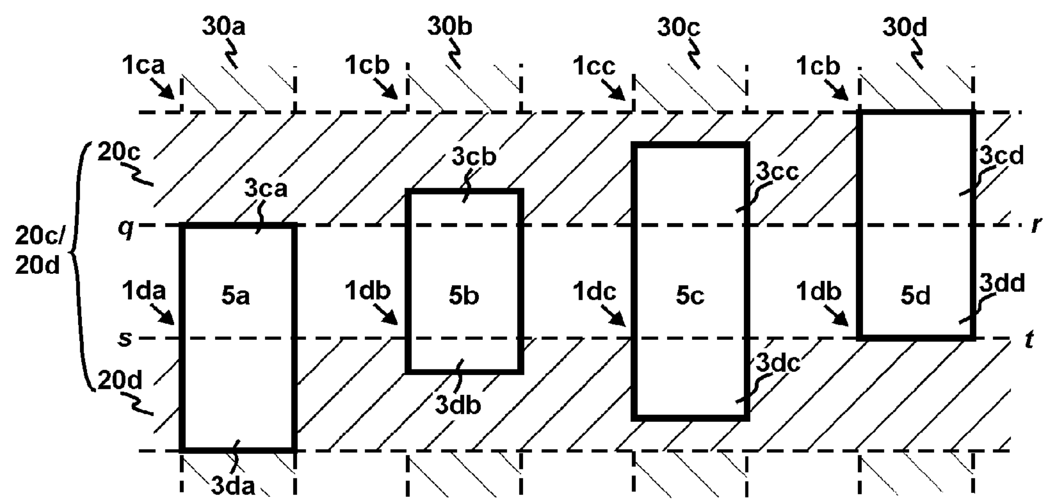
FIGS. 5A-5B illustrate two preferred 4-ary 3D-MPROM with merged opening-patterns.
Figure 5B:
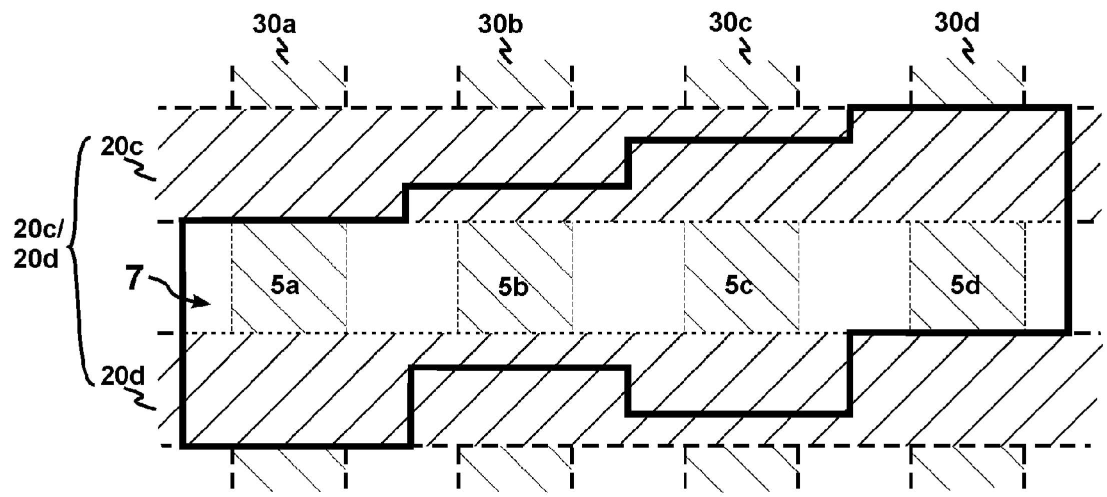

Referring now to FIGS. 5A-5B, two preferred 4-ary 3D-MPROM cells with merged opening-patterns are disclosed. In FIG. 5A, 4-ary 3D-MPROM cells 1ca, 1cb, 1cc, 1cd represent "$0_4$", "$1_4$", "$2_4$", "$3_4$", respectively. This is realized by shifting the opening-patterns 3ca, 3cb, 3cc, 3cd against the ASL 20c by different offsets, e.g. 1F, ⅔F, ⅓F, 0, respectively. In addition, adjacent upper ASLs (e.g. 20c and 20d) can be grouped into an ASL-pair 20c/20d. In each ASL-pair 20c/20d, the edge (e.g. 'qr') on each ASL (e.g. 20c) which is directly opposite to the other ASL (e.g. 20d) is referred to as inside edge. For example, edges 'qr' and 'st' are inside edges for the ASL-pair 20c/20d. To merge opening-patterns in an ASL-pair, the opening-patterns on each ASL are shifted to the inside edges. For example, opening-pattern 3cb is shifted to the inside edge 'qr' by −2F/3, and opening-pattern 3db is shifted to the inside edge 'st' by +2F/3; they are merged into a single opening-pattern 5b (enclosed by the thick dark line). This results in opening-patterns with y dimension >1F. In this preferred embodiment, each partial-diode has an edge aligned with an inside edge of the ASL-pair.

In FIG. 5B, opening-patterns 5a-5d of FIG. 5A can further expand along the +x and −x directions until they are merged with their respective neighbors. For example, opening-pattern 5c can expand towards +x direction until it is merged with 5d; it can also expand towards the −x direction until it is merged with 5b. In fact, all opening-patterns 5a-5d on the ASL-pair 20c/20d can be merged into a single opening-pattern 7 (enclosed by the thick dark line). Its minimum feature size is 5F/3 (at the location of opening-pattern 5b). Apparently, the opening-mask associated with this preferred embodiment has a significantly lower cost. It should be noted that the rightmost and leftmost edges of the opening-pattern 7 can be further expanded and merged with opening-patterns not shown on this drawing sheet.

Figure 6A:
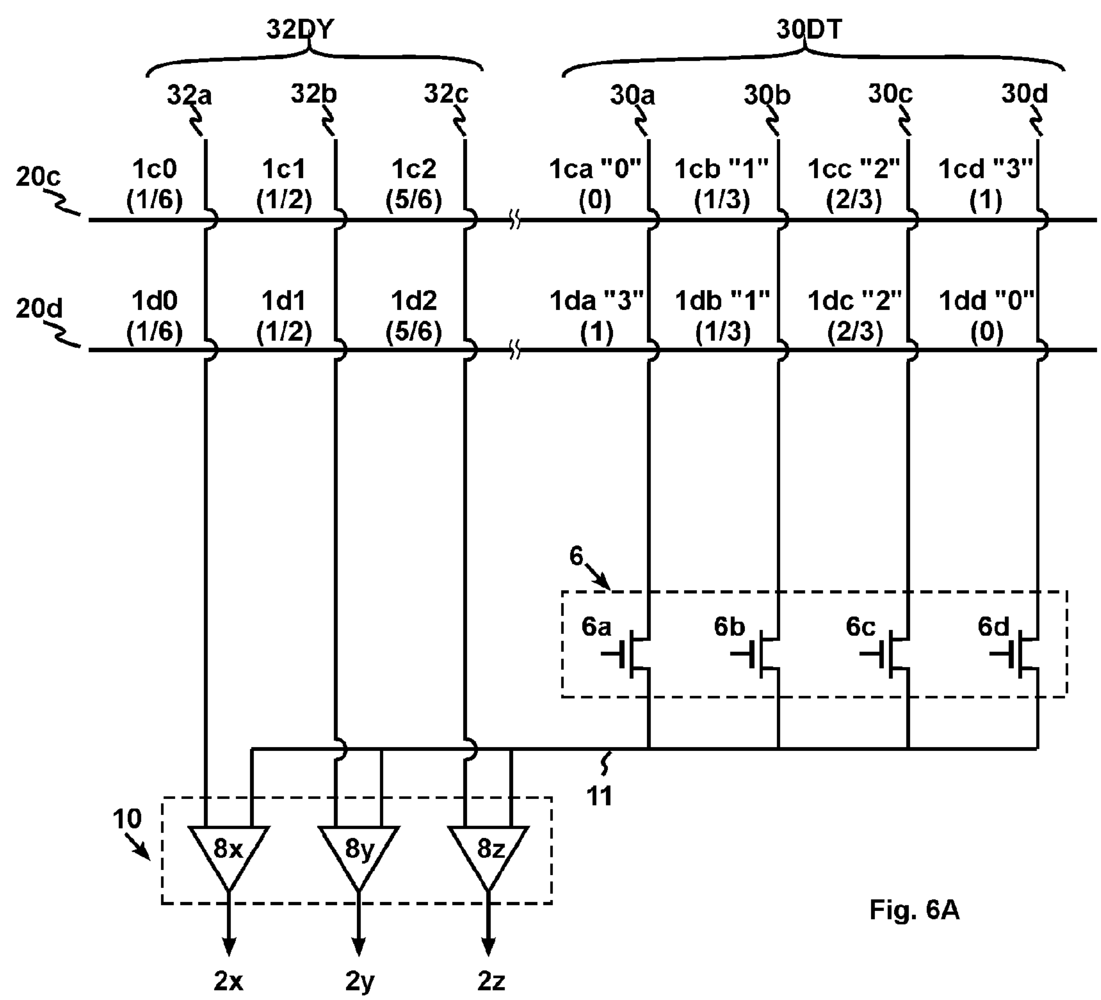
FIGS. 6A-6C illustrate three preferred read-out circuits.
Figure 6B:
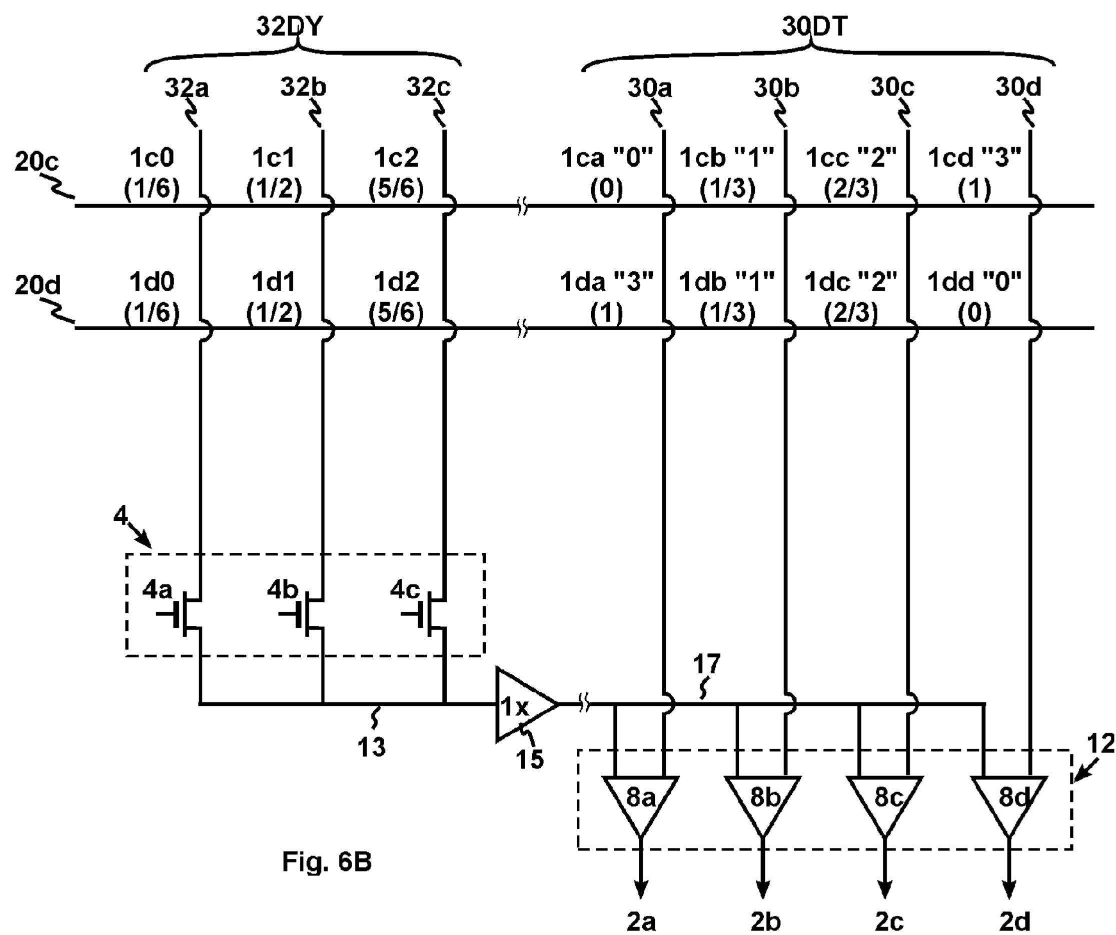
Figures 6C, 7:
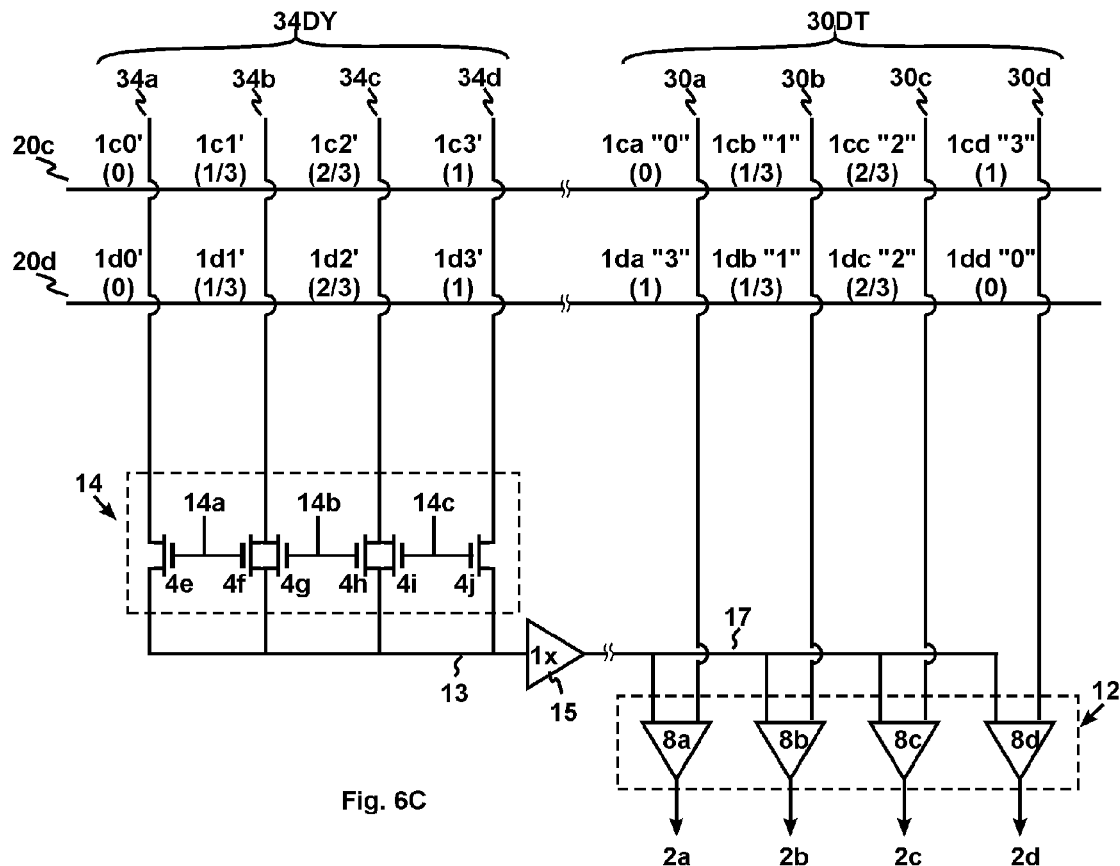
FIG. 7 illustrates two sets of diode-area ratios (r) for a preferred 4-ary 3D-MPROM.

Referring now FIGS. 6A-6C, three preferred 4-ary 3D-MPROM read-out circuits are disclosed (diodes in the memory array are left un-drawn in these figures). These read-out circuits use dummy cells to provide reference bit-line voltage. Similar to memory cells, dummy cells comprise partial-diodes with different r values. In FIGS. 6A-6B, the r values of the dummy cells are different from memory cells; in FIG. 6C, the dummy cells can take the same r values as memory cells. In these figures, number in double quotes is the state value of a cell; number in parentheses is its r value.

FIG. 6A illustrates a first preferred read-out circuit. It comprises four data bit-lines 30a-30d (collectively referred to as data group 30DT) and three dummy bit-lines 32a-32c (collectively referred to as dummy group 32DY). The dummy r values are between those of memory cells, e.g. the dummy r values are ⅙, ½, and ⅚; while the data r values are 0, ⅓, ⅔ and 1. The read-out circuit further comprises a column decoder (or a mux) 6 and an A/D converter 10. The column decoder 6 comprises transistors (or, switches) 6a-6d, only one of which is allowed to turn on each time. The A/D converter 10 comprises comparators (or, sense amplifiers) 8x-8z.

The read-out sequence for this preferred embodiment works as follows. To read out cell 1cc, transistor 6c in the column decoder 6 is turned on. Bit-line signal 30c is sent to signal line 11 and then to the A/D converter 10. It is further compared with the dummy bit-line signals 32a-32c at each comparator 8x-8z. Because cell 1cc carries "$2_4$", the A/D converter outputs 2x-2y is 1, 1, 0, respectively. These outputs can be used to retrieve data stored at cell 1cc.

FIG. 6B illustrates a second preferred read-out circuit. In this preferred embodiment, each data bit-line 30a-30d is connected with one input of comparator (or, sense-amplifier) 8a-8d; each dummy bit-line (32a-32c) is connected to signal line 13 through a column decoder (or a mux) 4; signal line 13 is fed into the other input of all comparators 8a-8d. The column decoder 4 comprises transistors (or, switches) 4a-4c, only one of which is allowed to turn on each time. Optionally, a 1× driver 15 can be added to signal line 13 to help drive the inputs of comparators 8a-8d. Each read action needs at least N−1 (i.e. 3 for this preferred embodiment) read cycles:

A) During the first read cycle, only transistor 4a is turned on. Dummy signal 32a is compared with data bit-line signals 30a-30d at comparators 8a-8d. The outputs 2a-2d are 0, 1, 1, 1, respectively and stored in a first buffer.

B) During the second read cycle, only transistor 4b is turned on. Dummy signal 32b is compared with data bit-line signals 30a-30d at each comparator 8a-8d. The outputs 2a-2d are 0, 0, 1, 1, respectively and stored in a second buffer.

C) During the third read cycle, only transistor 4c is turned on. Dummy signal 32b is compared with data bit-line signals 30a-30d at comparators 8a-8d. The outputs 2a-2d are 0, 0, 0, 1, respectively and stored in a third buffer.

D) Finally, outputs stored in the first, second and third buffers are used to calculate data stored at cells 1ca-1cd.

FIG. 6C illustrates a third preferred read-out circuit. Instead of using dummy cells with r values different from memory cells (FIGS. 6A-6B), the dummy cells 1c0'-1c3' in this preferred embodiment use the same r values as memory cells 1ca-1cd, i.e. 0, ⅓, ⅔, and 1. Each N-3DMPROM unit array needs N dummy bit-lines. Decoder (or a mux) 14 comprises three switch signals 14a-14c. Each switch signal (e.g. 14a) can simultaneously turn on two transistors (or, switches) (e.g. 4e and 4f) and connect two bit-lines (e.g. 34a and 34b) to a same signal line 13. Because of this, the voltage on signal line 13 is effectively the average voltage of these two bit-lines (e.g. 34a and 34b). Hence, the equivalent dummy r value during this read cycle is ⅙, same as dummy cell 1c0. The rest of read-out operation is same as that in FIG. 6B. Because dummy cells use the same r values as memory cells, it is easier to make the opening mask, which helps to further reduce the mask cost.

Referring now to FIG. 7, two sets of preferred r values for a 4-ary 3D-MPROM are disclosed. In the first set, r values are evenly distributed between 0 (no-diode) and 1 (full-diode). This r distribution is suitable for an ideal manufacturing condition, e.g. there is no mis-alignment during lithography. For the second set, r values are distributed un-evenly, e.g. the first r increment (Δr) (Δr=0.37 from "$0_4$" to "$1_4$") is larger than the next Δr (Δr=0.27 from "$1_4$" to "$2_4$"). This r set can better accommodate mis-alignment during lithography and provide a wider process margin. For example, if the upper-ASL mask is mis-aligned to the opening mask by 10% along −y direction (FIG. 5B), for the first r set, the effective r values for "$0_4$"-"$3_4$" cells become 0.1, 0.43, 0.77, 1 (on silicon) and Δr could be as small as 0.23; for the second r set, the effective r values are 0.1, 0.47, 0.74, 1 (on silicon) and the smallest Δr is 0.26, larger than the first set. A larger Δr can reduce the complexity in read-out circuit design. Eq. (1) discloses a preferred method to calculate r values for different states, taking into account of mis-alignment:

$$r[0_N]=0;$$

$$r[i_N]=MA+i\times x \quad (i=1 \ldots N-2);$$

$$r[(N-1)_N]=1, \text{ and}$$

$$x=(1-2\times MA)/(N-1), \qquad \text{Eq. (1)}$$

where, MA is the maximum allowed mis-alignment in unit of F.

Figure 8A:
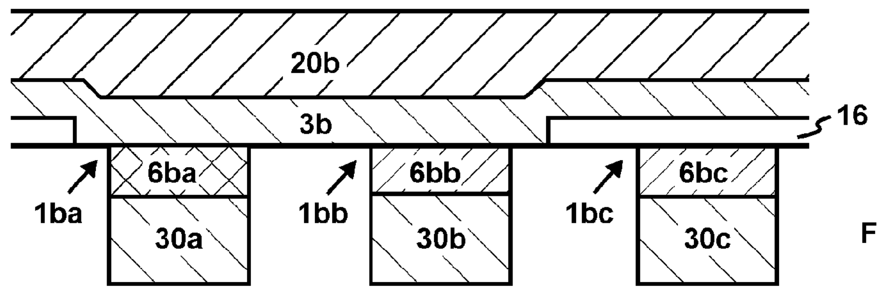
FIG. 8A illustrates a preferred junction-defined N-3DMPROM.
Figure 8B:
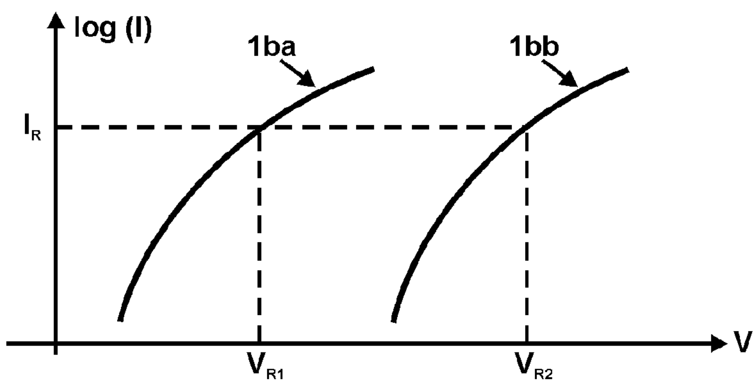
FIG. 8B illustrates its current-voltage (I-V) relationship.

Besides geometry-defined, N-3DMPROM can also be junction-defined. In a junction-defined N-3DMPROM, memory cells in at least two different states have different junctions. A commonly varied junction is doping profile. With different doping profiles, the cell current-voltage relationship varies. FIG. 8A illustrates a preferred junction-defined N-3DMPROM. It is a 3-ary 3D-MPROM and its cells 1_ba_-1_bc_ have different diode junction: the diode junction 6_ba_ in cell 1_ba_ is more heavily doped than the diode junction 6_bb_ in cell 1_bb_; and cell 1_bc_ has an insulating dielectric 16. Accordingly, cell 1_ba_ conducts more current than cell 1_bb_, and cell 1_bc_ conducts no current. For the same read current $I_R$, cell 1_bb_ needs a larger read voltage $V_{R2}$ than cell 1_ba_, i.e. $V_{R1}$ (FIG. 8B).

Figure 9A:
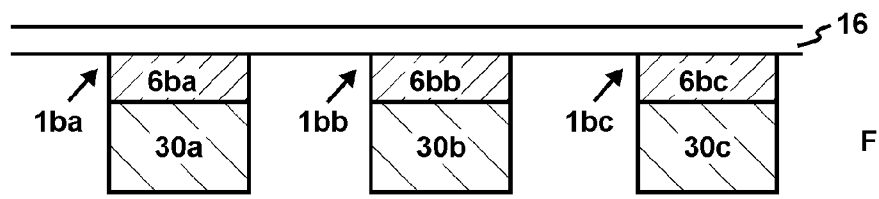
Figure 9B:
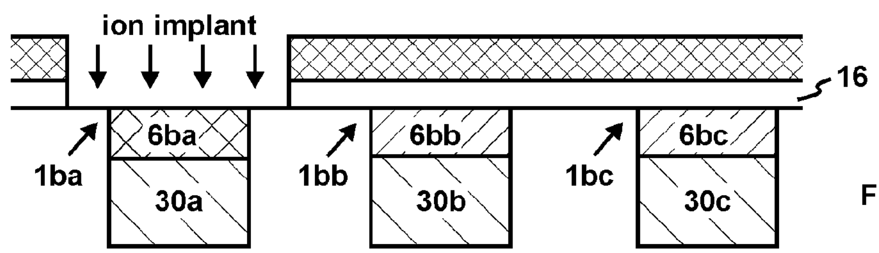

FIGS. 9A-9C illustrate a preferred manufacturing process of a junction-defined N-3DMPROM. It comprises the following steps: A) form lower ASLs 30_a_, 30_b_, 30_c_. Each lower ASL comprises an N-layer 3_ba_-3_bc_. At this step, all these N-layers 3_ba_-3_bc_ have the same doping profile. After this, form an insulating dielectric 16 on top of the lower ASLs (FIG. 9A); B) apply a first opening mask and etch away the insulating dielectric 16 in cell area 1_ba_. Then perform an ion-implantation step to increase the doping concentration at junction 6_ba_ (FIG. 9B); C) apply a second opening mask and etch away the insulating dielectric 16 in cell 1_bb_ (FIG. 9C); D) Remove photo-resist and form the upper ASL 20_b_, including P-layer 3_b_ (FIG. 8A).

FIG. 10A illustrates a preferred read-out circuit for a junction-defined N-3DMPROM. The larger diode 7_ba_ at cell 1_ba_ represents carries more read current. Each bit line (e.g. 30_a_) is connected to a sense-amplifier (e.g. 8_a_) and a current-limiting circuit (e.g. 32_a_). The sense-amplifier 8_a_ flips its output 2_a_ when the voltage rise on ASL 30_a_ (i.e. bit line) exceeds a threshold-voltage. The current-limiting circuit 32_a_ limits the current flow through the diode 7_ba_. As is illustrated in FIG. 10B, it may comprise a switch (or, transistor) 34_a_ and a voltage source $V_H$. The switch 34_a_ is controlled by the output 2_a_ of the sense-amplifier 8_a_. When the output 2_a_ is high, the switch 34_a_ is closed and the voltage on ASL 30_a_ is tied to $V_H$.

FIG. 10C is a timing-diagram of the word-line voltage and bit-line voltage. This read-out process comprises two read-phases T1, T2. During T1, read voltage $V_{R1}$ is applied to word line (e.g. 20_b_). The word line starts to charge the bit lines (e.g. 30_a_) through the diode (e.g. 7_ba_) in the memory cell (e.g. 1_ba_). When the bit line voltage rises above the threshold-voltage $V_T$, cell 1_ba_ is sensed as "1". On the other hand, cell 1_bb_ conducts less current than 1_ba_ and cannot trigger the sense-amplifier 8_b_ during T1, neither does 1_bc_. They are sensed as "0". During T2, read voltage $V_{R2}$ ($V_{R2}>V_{R1}$) is applied to word line 20_b_. With this larger read voltage (FIG. 8B), cell 1_bb_ is sensed as "1", while cell 1_bc_ still conducts no current and is again sensed as "0". It should be noted that during T2, current-limiting circuit 32_a_ for cell 1_ba_ is turned on. Accordingly, the voltage on bit line 30_a_ rises to $V_H$ and voltage drop on the diode 7_ba_ becomes $V_{R2}-V_H$. With a smaller voltage drop, the current flow through the diode 7_ba_ is small enough to cause any damage. After T1, T2, data stored in cells 1_ba_-1_bc_ can be calculated back based on the outputs 2_a_-2_c_ obtained in these read-phases.

Besides geometry-defined and junction-defined N-3DMPROMs, other forms of N-3DMPROM may be used. One example is hybrid N-3DMPROM. It combines geometry-defined N-3DMPROM with junction-defined N-3DMPROM. To be more specific, both the geometry and junction of the memory cells are varied. As a result, an even large number of bits can be stored in each cell.

While illustrative embodiments have been shown and described, it would be apparent to those skilled in the art that may more modifications than that have been mentioned above are possible without departing from the inventive concepts set forth therein. The invention, therefore, is not to be limited except in the spirit of the appended claims.

What is claimed is:

1. An N-ary three-dimensional mask-programmable read-only memory, comprising:

a semiconductor substrate including transistors;

a plurality of mask-programmable memory levels vertically stacked above and coupled to said substrate through a plurality of contact vias inside said memory, each of said memory levels comprising a plurality of mask-programmable memory cells, each of said memory cells comprising a diode-like device, wherein said memory cells have at least N possible states with N>2, and memory cells in different states have different ranges of read current at a read voltage;

wherein said substrate further comprises means for converting data from said memory levels into binary.

2. The N-ary three-dimensional mask-programmable read-only memory according to claim 1, wherein at least a portion of said converting means is located directly under at least one of said memory levels.

3. The N-ary three-dimensional mask-programmable read-only memory according to claim 1, wherein memory cells in a same state have substantially the same structure, and memory cells in at least three different states have different structures.

4. The N-ary three-dimensional mask-programmable read-only memory according to claim 1, wherein memory cells in a same state have substantially the same junction, and memory cells in at least two different states have different junctions.

5. The N-ary three-dimensional mask-programmable read-only memory according to claim 1, further comprising means for limiting the read current through memory cell under read.

6. The N-ary three-dimensional mask-programmable read-only memory according to claim 1, wherein at least two read voltages are applied in sequence to selected memory cells during read.

7. The N-ary three-dimensional mask-programmable read-only memory according to claim 1, wherein N is an integral power of 2.

8. The N-ary three-dimensional mask-programmable read-only memory according to claim 1, wherein N is a non-integral power of 2.

9. An N-ary three-dimensional mask-programmable read-only memory, comprising:

a semiconductor substrate including transistors;

a plurality of mask-programmable memory levels vertically stacked above and coupled to said substrate through a plurality of contact vias inside said memory, each of said memory levels comprising a plurality of mask-programmable memory cells and dummy cells, each of said cells comprising a diode-like device, wherein said memory cells have at least N possible states with N>2, and memory cells in different states have different ranges of read current at a read voltage;

wherein said substrate further comprises means for comparing a first input from a selected memory cell and a second input from at least a selected dummy cell.

10. The N-ary three-dimensional mask-programmable read-only memory according to claim 9, wherein said second input is coupled to first and second dummy cells, said first dummy cell having a first one of said N possible states and said second dummy cell having a second one of said N possible states.

11. The N-ary three-dimensional mask-programmable read-only memory according to claim 9, wherein memory cells in a same state have substantially the same structure, and memory cells in at least three different states have different structures.

12. The N-ary three-dimensional mask-programmable read-only memory according to claim 9, wherein memory cells in a same state have substantially the same junction, and memory cells in at least two different states have different junctions.

13. An N-ary three-dimensional mask-programmable read-only memory, comprising:

a semiconductor substrate including transistors;

a plurality of mask-programmable memory levels vertically stacked above and coupled to said substrate through a plurality of contact vias inside said memory, each of said memory levels comprising a plurality of mask-programmable memory cells, each of said memory cells comprising an upper address-selection line, a lower address-select line and a diode-like device;

wherein said memory cells have at least N possible states with N>2, and memory cells in different states have different ranges of read current at a read voltage; memory cells in a same state have substantially the same structure, and memory cells in at least three different states have different structures.

14. The N-ary three-dimensional mask-programmable read-only memory according to claim 13, wherein memory cells in a same state have substantially the same geometry, and memory cells in at least three different states have different geometries.

15. The N-ary three-dimensional mask-programmable read-only memory according to claim 13, wherein said memory cell further comprises a contact-area smaller than the overlapping area between said lower and upper address-selection lines, wherein said contact-area is the smallest current conduction area in said memory cell.

16. The N-ary three-dimensional mask-programmable read-only memory according to claim 15, wherein an edge of said contact-area aligns with an edge of said upper address-selection line.

17. The N-ary three-dimensional mask-programmable read-only memory according to claim 15, wherein the sizes of contact-areas from different states are unevenly distributed.

18. An N-ary three-dimensional mask-programmable read-only memory, comprising:

a semiconductor substrate including transistors;

a plurality of mask-programmable memory levels vertically stacked above and coupled to said substrate through a plurality of contact vias inside said memory, each of said memory levels comprising a plurality of mask-programmable memory cells, each of said memory cells comprising an upper address-selection line, a lower address-select line and a diode-like device;

wherein said memory cells have at least N possible states with N>2, and memory cells in different states have different ranges of read current at a read voltage; memory cells in a same state have substantially the same junction, and memory cells in at least two different states have different junctions.

19. The N-ary three-dimensional mask-programmable read-only memory according to claim 18, wherein said diode-like device has a doping profile, and memory cells in at least two different states have different doping profiles.

20. The N-ary three-dimensional mask-programmable read-only memory according to claim 18, wherein memory cells in at least two different states have different structures.

* * * * *